United States Patent
Chen et al.

(10) Patent No.: US 7,763,489 B2
(45) Date of Patent: Jul. 27, 2010

(54) METHOD OF FORMING A MICROMECHANICAL SYSTEM CONTAINING A MICROFLUIDIC LUBRICANT CHANNEL

(75) Inventors: Dongmin Chen, Saratoga, CA (US); William Spencer Worley, Half Moon Bay, CA (US)

(73) Assignee: Miradia, Inc., Santa Clara, CA (US)

( * ) Notice: Subject to any disclaimer, the term of this patent is extended or adjusted under 35 U.S.C. 154(b) by 591 days.

(21) Appl. No.: 11/538,035

(22) Filed: Oct. 2, 2006

(65) Prior Publication Data

US 2008/0081427 A1 Apr. 3, 2008

Related U.S. Application Data

(60) Provisional application No. 60/847,831, filed on Sep. 27, 2006.

(51) Int. Cl.
*H01L 21/00* (2006.01)
(52) U.S. Cl. ..................... 438/51; 438/52; 257/E29.324
(58) Field of Classification Search ................. 438/381, 438/51, 52; 257/E29.324
See application file for complete search history.

(56) References Cited

U.S. PATENT DOCUMENTS

| | | |
|---|---|---|
| 5,936,758 A | 8/1999 | Fisher et al. |
| 6,806,993 B1 * | 10/2004 | Adams et al. ................ 359/291 |
| 6,843,936 B1 | 1/2005 | Jacobs |
| 6,930,367 B2 | 8/2005 | Lutz et al. |
| 6,946,728 B2 | 9/2005 | Chen et al. |
| 6,956,283 B1 | 10/2005 | Peterson |
| 6,958,846 B2 | 10/2005 | Huibers et al. |
| 6,979,893 B2 | 12/2005 | Dunphy et al. |
| 7,068,417 B2 | 6/2006 | Yang |
| 7,141,870 B2 | 11/2006 | Yang |
| 2005/0101059 A1 | 5/2005 | Yang |
| 2005/0121166 A1 | 6/2005 | Dubay |
| 2005/0212067 A1 | 9/2005 | Duboc et al. |
| 2006/0117839 A1 * | 6/2006 | Fortin et al. ................ 73/61.73 |
| 2006/0148121 A1 | 7/2006 | Yang |

* cited by examiner

*Primary Examiner*—Matthew C Landau
*Assistant Examiner*—Vivki B Booker
(74) *Attorney, Agent, or Firm*—Patterson & Sheridan, LLP

(57) ABSTRACT

Embodiments of the present invention generally relate to a electromechanical device that has an improved usable lifetime due to the presence of one or more channels that contain and deliver a lubricant material that can reduce the likelihood of stiction occurring between the various moving parts of the device. Embodiments of the present invention also generally include an enclosed device package, and a method of forming the enclosed device package, that has one or more lubricant containing and/or transporting channels that that deliver lubricant material to a device disposed within the enclosed device package. Each lubricant containing channel acts as a ready supply of "fresh" lubricant to prevent stiction from occurring between interacting components of the device disposed within the enclosed region of the device package. The ready supply of "fresh" lubricants may also be used to replenish damaged lubricants (worn-off, broken down, etc) at the contacting surfaces where stiction generally occurs.

8 Claims, 13 Drawing Sheets

METHOD OF FORMING A MICROMECHANICAL SYSTEM CONTAINING A MICROFLUIDIC LUBRICANT CHANNEL

CROSS-REFERENCE TO RELATED APPLICATIONS

This application claims benefit of U.S. Provisional Patent Application Ser. No. 60/847,831, filed Sep. 27, 2006 [Express Mail Label No. EV699402668US], and entitled "Method of Sealing A Microfluidic Lubricant Channel Formed in a Micromechanical Device", which is herein incorporated by reference.

BACKGROUND OF THE INVENTION

1. Field of the Invention

Embodiments of the present invention relate generally to micro-electro-mechanical and nano-electro-mechanical systems and more specifically to an anti-stiction and lubrication for such systems.

2. Description of the Related Art

As is well-known, atomic level and microscopic level forces between device components become far more critical as devices become smaller. Micromechanical devices, such as Micro-electro-mechanical systems (MEMS) and nano-electro-mechanical systems (NEMS), are an area where problems related to these types of forces are quite prevalent. In particular, "stiction" forces created between moving parts that come into contact with one another, either intentionally or accidentally, during operation are a common problem with micromechanical devices. Stiction-type failures occur when the interfacial attraction forces created between moving parts that come into contact with one another exceed restoring forces. As a result, the surfaces of these parts either permanently or temporarily adhere to each other, causing device failure or malfunction. Stiction forces are complex surface phenomena that generally include capillary forces, Van der Waal's forces and electrostatic attraction forces. As used herein, the term "contact" refers generally to any interaction between two surfaces and is not limited to the actual physical touching of the surfaces. Some examples of typical micromechanical devices are RF switches, optical modulators, microgears, accelerometers, worm gears, transducers, fluid nozzles, gyroscopes, and other similar devices or actuators. It should be noted that the term "MEMS device" is used hereafter to generally describe a micromechanical device, such as a conventional MEMS or NEMS devices discussed above.

The stiction issue is especially problematic in devices such as the RF switch, optical modulator, microgears, and other actuators. Various elements in these devices often interact with each other during operation at frequencies between a few hertz (Hz) and about a few gigahertz (GHz). Various analyses have shown that, without adding some form of lubrication to these types of devices to reduce stiction and wear between component surfaces, product lifetimes may range from only a few contacts to a few thousand contacts, which is generally well below a commercially viable lifetime. Consequently, one of the biggest challenges facing the MEMS and NEMS industries is the long-term reliability of contacting microstructures in the face of stiction.

Several techniques to address the stiction between two contacting surfaces have been discussed in various publications. These techniques include texturing the surfaces (e.g., micro patterning or laser patterning) to reduce the overall adhesion force by reducing the effective contact area, and selecting specific materials from which the contacting surfaces are made to lower the surface energy, reduce charging, or contact potential difference between components.

Moreover, some prior references have suggested the insertion of a "lubricant" into the region around the interacting devices to reduce the chance of stiction-related failures. Such a lubricant often times is in a solid or liquid state, depending on the properties of the material, and the temperature and pressure or environment in which the lubricant is placed. In general, the terms a "solid" lubricant or a "liquid" lubricant is a lubricant that is in a solid or liquid state under ambient conditions, which is typically defined as room temperate and atmospheric pressure. Some prior art references describe a lubricant as being in a "vapor" state. These references use of the term vapor phase lubricant to generally describe a mixture of components that contain a carrier gas (e.g., nitrogen) and a vaporized second component that is a solid or liquid at temperatures and pressures near ambient conditions (e.g., STP). In most conventional applications the solid or liquid lubricant remains in a solid or liquid state at temperatures much higher than room temperature and pressures much lower than atmospheric pressure conditions.

Examples of typical lubricants that are solid or liquid at ambient conditions and temperatures well above ambient temperature can be found in reference such as U.S. patent application Ser. No. 6,930,367. Such prior art lubricants include dichlordimethylsilane ("DDMS"), octadecyltrichlorsilane ("OTS"), perfluoroctyltrichlorsilane ("PFOTCS"), perfluorodecanoic acid ("PFDA"), perfluorodecyl-trichlorosilane ("FDTS"), perfluoro polyether ("PFPE") and/or fluoroalkylsilane ("FOTS") that are deposited on various interacting components by use of a vapor deposition process, such as atmospheric chemical vapor deposition (APCVD), low pressure chemical vapor deposition (LPCVD), plasma enhanced chemical vapor deposition (PECVD), or other similar deposition processes.

The technique of forming the low-surface energy organic passivation layer on the surface of a MEMS components is commonly referred to in the art as "vapor lubricant" coating. One serious draw back to using low-surface energy organic passivation layer, such as SAM coatings, is that they typically are only one monolayer thick, although coatings that are a few monolayers have also been reported. Generally, these types of coatings have a very limited usable lifetime, since they are easily damaged or displaced due to impact or wear created by the interaction of the various moving components. This is inevitably happens in MEMS devices with contacting surfaces, such as light modulator and RF switches, that are subject to frequent contact in use and a large number of contacts during the product lifetime. Without some way to reliably restore or repair the damaged coatings, stiction inevitably returns, and device failure results.

As shown in FIG. 1A, one approach for lubricating MEMS components is to provide a getter 110 within the package 100 (that includes a base 111, a lid 104, and a seal 106) in which an array of MEMS devices 108 resides. FIG. 1B illustrates one conventional package 120 that contains a MEMS device 108 and a getter 110 positioned within the head space 124 of the package 120. The package 120 also contains a package substrate 128, window 126 and spacer ring 125. These two configurations are further described in U.S. patent application Ser. No. 6,843,936 and U.S. patent application Ser. No. 6,979,893, respectively. As previously indicated, these conventional devices employ some type of reversibly-absorbing getter to store the lubricant molecules in the zeolite crystals or internal volume of a micro-tube. In these types of designs, a supply of lubricant is maintained in the getter 110, and an amount of lubricant needed to lubricate the MEMS device 108 is discharged during normal operation. However, adding the reversibly absorbing getter, or reservoirs, to retain the liquid lubricants increases package size and packaging complexity and adds steps to the fabrication process, all of which increase piece-part cost as well as the overall manufacturing cost of MEMS or NEMS devices. Thus, forming a device that uses these techniques generally requires a number of labor-intensive and costly processing steps, such as mixing the getter material, applying the getter material to the device containing package, curing the getter material, conditioning or activating the getter material, and then sealing the MEMS device and the getter within the sealed package.

Particles and contamination found in our everyday atmospheric environment can have an effect on the device yield of a MEMS fabrication process and the average lifetime of a MEMS device. In an effort to prevent contamination during fabrication, the multiple process steps used to form a MEMS device are usually completed in a clean room environment. Due to the high cost required to form and maintain a clean room environment, the more steps that need to be completed in a clean room environment the more expensive the component is to make. Typically, MEMS device manufacturing processes are performed in Class 10 or better clean room environments, which can costs about $2,000 per square foot to build and $1 million a year to operate. Therefore, there is a need to create a MEMS device fabrication process reduces the number of processing steps that are required to be performed in a clean room environment.

As noted above, in an effort to isolate the MEMS components from the everyday atmospheric environment, MEMS device manufacturers typically enclose the MEMS device within a device package such that a sealed environment is formed around the MEMS components. Conventional device packaging processes commonly require the lubricating materials that are contained within the MEMS device package be exposed to high temperature excursions during the MEMS device package sealing processes, particularly wafer level hermetic packaging. Typically, conventional sealing processes, such as glass frit bonding or eutectic bonding, require that the MEMS device, lubricant materials, and other device components be heated to temperatures between about 350° C. to about 450° C. These high-bonding temperatures severely limit the type of lubricants that can be used in a device package and also cause the lubricant to break down after a prolonged period of exposure. Therefore, there is also a need for a MEMS device package fabricating process that eliminates or minimizes the exposure of lubricating material to high temperatures during the device fabrication process.

SUMMARY OF THE INVENTION

One embodiment of the invention sets forth a process for forming a micromechanical device assembly, the process comprising forming a micromechanical device that includes a moveable component having a first contact surface, wherein the first contact surface interacts with a second contact surface during device operation, positioning the micromechanical device within a processing region that is formed between one or more inner surfaces of one or more walls of an enclosure, and forming a fluid channel in the one or more walls of the enclosure, wherein the fluid channel extends between at least one of the one or more inner surfaces and an exterior surface of the one or more walls.

Embodiments of the invention may further provide a process for forming a micromechanical device assembly, the process comprising forming a lid having one or more walls, wherein the lid has an interior surface and an exterior surface, forming a base that has an interior surface and an exterior surface, forming a micromechanical device that includes a moveable component having a first contact surface, wherein the first contact surface interacts with a second contact surface during device operation, forming a fluid channel in the base or the lid that extends between the interior surface and the exterior surface, forming a processing region by bonding the lid to the base, wherein the processing region is adjacent to the interior surfaces of the lid and the base, positioning the micromechanical device in the processing region, and disposing a lubricant within the fluid channel.

Embodiments of the invention may further provide a process for forming a plurality of micromechanical device assemblies, the process comprising forming a lid having an first bonding surface, forming an interposer having a plurality of through holes formed therein, wherein an interior surface is formed in the interposer by each of the through holes, forming a plurality of micromechanical device assemblies on a surface of a substrate, wherein the micromechanical device assemblies each include a moveable component having a first contact surface that interacts with a second contact surface during device operation, bonding the first bonding surface to the second bonding surface using a first bonding process to form a lid assembly, wherein a plurality of recessed regions are formed between the interior surfaces of the interposer and a surface of the lid, positioning and aligning the plurality of formed recessed regions relative to the plurality of micromechanical device assemblies formed on the substrate so that each of the micromechanical device assemblies can be placed within a recessed region, bonding the lid assembly to the substrate using a second bonding process to form a plurality of processing regions formed between the recessed regions and a surface of the substrate, wherein one or more of the micromechanical assemblies are positioned within the processing regions, forming a plurality of fluid channels in the interposer, lid, or substrate so that a portion of at least one fluid channel is in communication with each of the processing regions, and dicing the substrate and the lid assembly to form a plurality of sealed micromechanical device assemblies, wherein each of the sealed micromechanical device assemblies comprise a portion of the substrate, a portion of the lid assembly and one or more of the micromechanical device assemblies positioned within the processing region.

One advantage of the disclosed micromechanical device is that a reservoir of a lubricating material is formed within a device package so that an amount of "fresh" lubricating material can be delivered to areas where stiction may occur. In one aspect, the lubricating material is contained in one or more channels that are adapted to evenly deliver a mobile lubricant to interacting areas of the MEMS device. In another aspect, different lubricant materials can be bought in to the device in a sequential manner via one channel, or contained concurrently in separate channels. Consequently, the lubricant delivery techniques described herein more reliably and cost effectively prevent stiction-related device failures relative to conventional lubricant delivery schemes.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1A schematically illustrates a cross-sectional view of a prior art device package containing a getter.

DETAILED DESCRIPTION

Embodiments of the present invention generally relate to a device that has an improved usable lifetime due to the presence of one or more channels that contain and deliver a lubricant material that can reduce the likelihood of stiction occurring between the various moving parts of an electromechanical device. Embodiments of the present invention also include an enclosed device package, and a method of forming the enclosed device package, that has one or more lubricant containing channels that that deliver lubricant material to a device disposed within the enclosed region of the device package. This lubricant containing channel(s) act as a ready supply of "fresh" lubricant to prevent stiction from occurring between interacting components of the device disposed within the enclosed region of the device package. The ready supply of "fresh" lubricants may also be used to replenish damaged lubricants (worn-off, broken down, etc) at the contacting surfaces where stiction generally occurs. In one example, aspects of this invention may be especially useful for fabricating and using micromechanical devices, such as MEMS devices, NEMS devices, or other similar thermal or fluidic devices. In one embodiment, the amount and type of lubricant disposed within the channel is selected so that "fresh" lubricant material is readily diffused or transported in a liquid, gas or vapor phase to all areas of the processing region to minimize the interaction of the moving components and thus reduce the chances of stiction-related failure. One of skill in the art recognizes that the term lubricant, as used herein, is intended to describe a material adapted to provide lubrication, anti-stiction, and/or anti-wear properties. In addition, the term lubricant, as used herein, is generally intended to describe a lubricant that is in a liquid, vapor and/or gaseous state during the operation and storage of a device.

Overview of Exemplary System

Figure 1A:
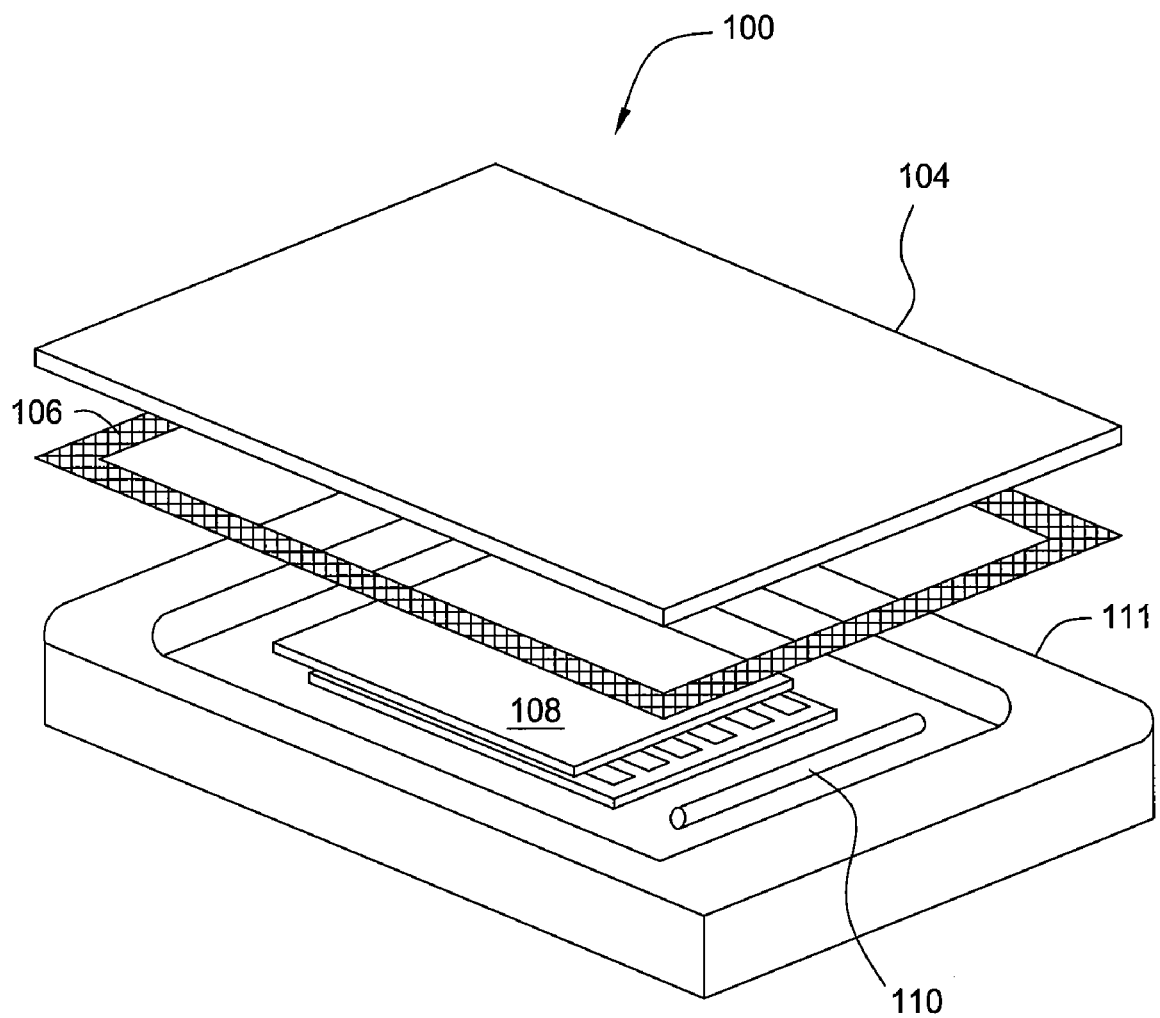
FIG. 1B schematically illustrates a cross-sectional view of another prior art device package containing a getter.
Figure 1B:
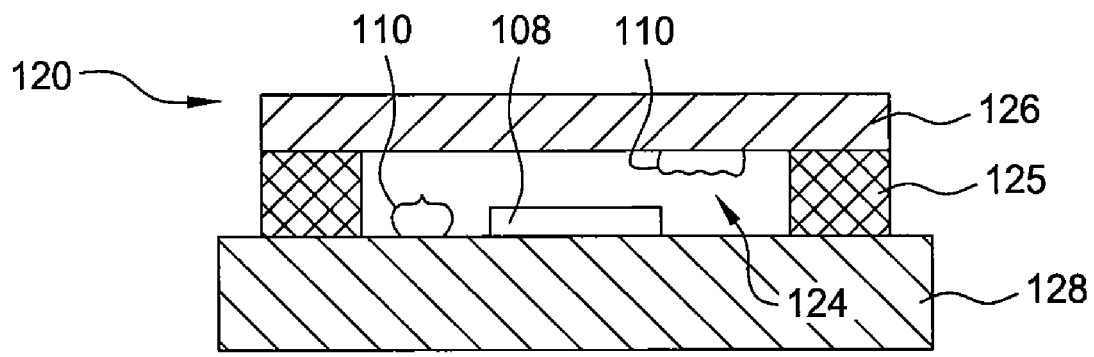
Figure 2A:
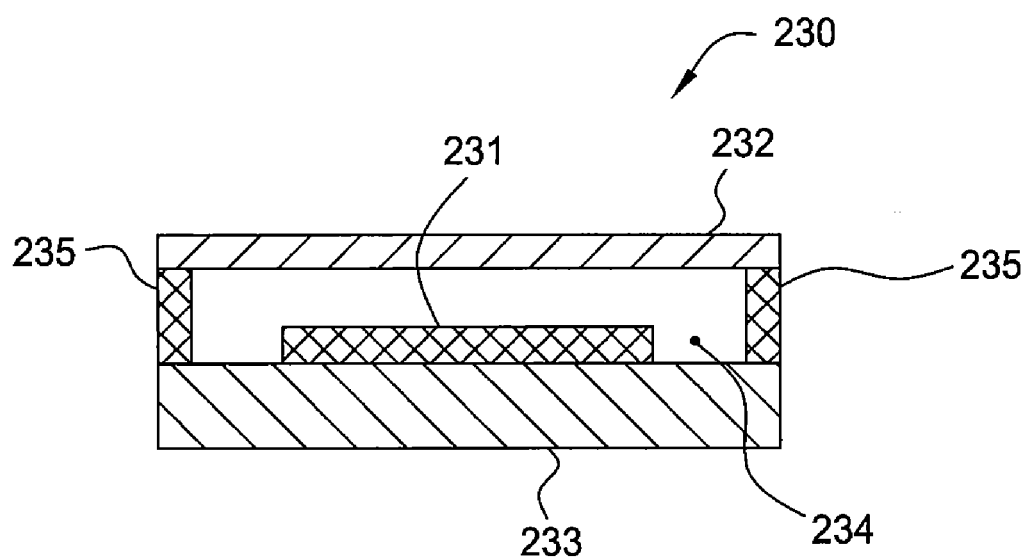
FIG. 2A illustrates a cross-sectional view of a device package assembly, according to one embodiment of the invention.

In an effort to prevent contamination from affecting the longevity of MEMS or NEMS components, these devices are typically enclosed within an environment that is isolated from external contamination, particles or other foreign material. FIG. 2A illustrates a cross-sectional view of a typical MEMS device package 230 that contains a MEMS device 231 that is enclosed within a processing region 234 formed between a lid 232, interposer 235 and a base 233. Typically, the lid 232, interposer 235 and base 233 are all hermetically or non-hermetically sealed so that the components within the processing region 234 are isolated from external contaminants and particles that may interfere with the use of the device.

Figure 2B:
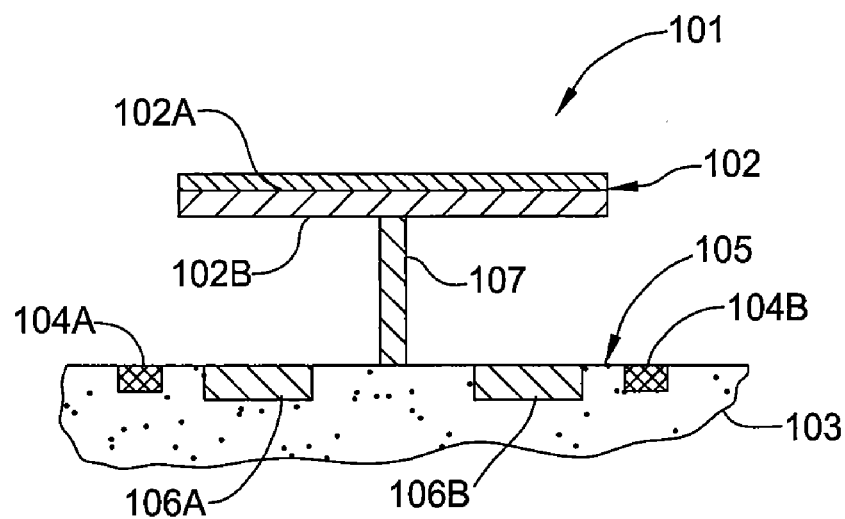
FIG. 2B schematically illustrates a cross-sectional view of a single mirror assembly 101, according to one embodiment of the invention.

FIG. 2B illustrates a representative micromechanical device that may be formed within the MEMS device 231 of FIG. 2A, which is used herein to describe various embodiments of the invention. The device shown in FIG. 2B schematically illustrates a cross-sectional view of a single mirror assembly 101 contained in a spatial light modulator (SLM). One should note that the MEMS device shown in FIG. 2B is not intended in any way to limit the scope of the invention described herein, since one skilled in the art would appreciate that the various embodiments described herein could be used in other MEMS, NEMS, larger scale actuators or sensors, or other comparable devices that experience stiction or other similarly related problems. While the discussion below specifically discusses the application of one or more of the various embodiments of the invention using a MEMS or NEMS type of device, these configurations also are not intended to be limiting as to the scope of the invention.

In general, a single mirror assembly 101 may contain a mirror 102, base 103, and a flexible member 107 that connects the mirror 102 to the base 103. The base 103 is generally provided with at least one electrode (elements 106A or 106B) formed on a surface 105 of the base 103. The base 103 can be made of any suitable material that is generally mechanically stable and can be formed using typical semiconductor processing techniques. In one aspect, the base 103 is formed from a semiconductor material, such as a silicon containing material, and processed according to standard semiconductor processing techniques. Other materials may be used in alternative embodiments of the invention. The electrodes 106A, 106B can be made of any materials that conduct electricity. In one aspect, the electrodes 106A, 106B are made of a metal (e.g., aluminum, titanium) preferentially deposited on the surface 105 of the base 103. A MEMS device of this type is described in the commonly assigned U.S. patent application Ser. No. 10/901,706, filed Jul. 28, 2004.

The mirror 102 generally contains a reflective surface 102A and a mirror base 102B. The reflective surface 102A is generally formed by depositing a metal layer, such as aluminum or other suitable material, on the mirror base 102B. The mirror 102 is attached to the base 103 by a flexible member 107. In one aspect, the flexible member 107 is a cantilever spring that is adapted to bend in response to an applied force and to subsequently return to its original shape after removal of the applied force. In one embodiment, the base 103 is fabricated from a first single piece of material, and the flexible member 107 and the mirror base 102B are fabricated from a second single piece of material, such as single crystal silicon. Importantly, the use of any device configuration that allows the surface of one component (e.g., mirror 102) to contact the surface of another component (e.g., base 103) during device operation, thereby leading to stiction-related problems, generally falls within the scope of the invention. For example, a simple cantilever beam that pivots about a hinge in response to an applied force such that one end of the cantilever beam contacts another surface of the device is within the scope of the invention.

In one aspect, one or more optional landing pads (elements 104A and 104B in FIG. 2B) are formed on the surface 105 of the base 103. The landing pads are formed, for example, by depositing a metal layer containing aluminum, titanium nitride, tungsten or other suitable materials. In other configurations, the landing pads may be made of silicon (Si), poly-silicon (poly-Si), silicon nitride (SiN), silicon carbide (SiC), diamond like carbon (DLC), copper (Cu), titanium (Ti) and/or other suitable materials.

Figure 2C:
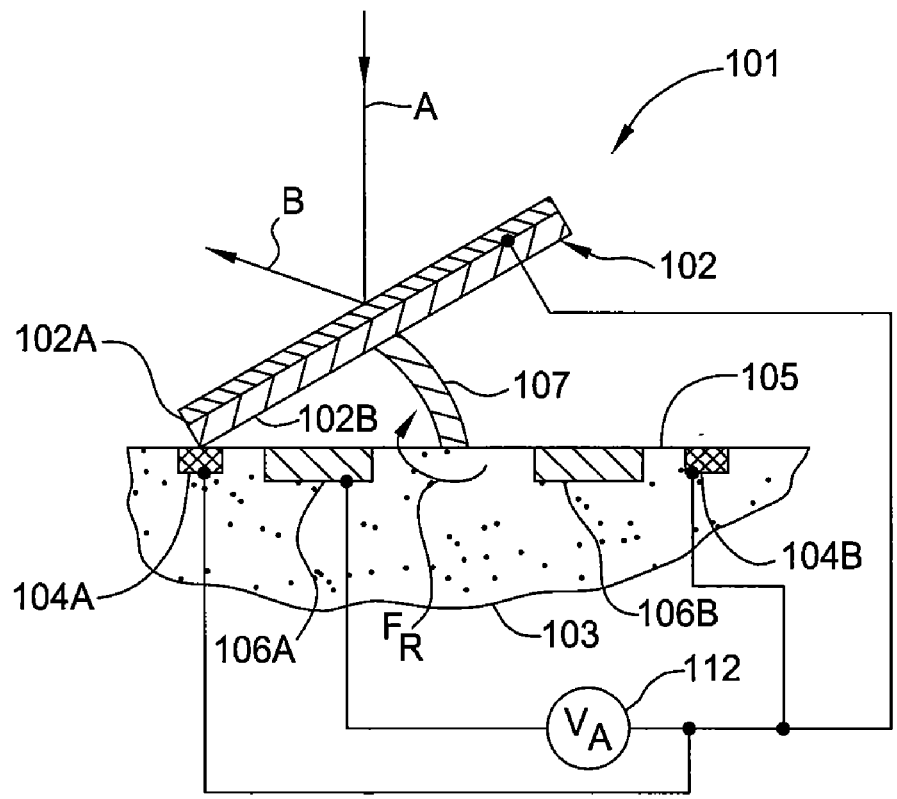
FIG. 2C schematically illustrates a cross-sectional view of a single mirror assembly 101 in a deflected state, according to one embodiment of the invention.

FIG. 2C illustrates the single mirror assembly 101 in a distorted state due to the application of an electrostatic force $F_E$ created by applying a voltage $V_A$ between the mirror 102 and the electrode 106A using a power supply 112. As shown in FIG. 2C, it is often desirable to bias a landing pad (e.g., elements 104A) to the same potential as the mirror 102 to eliminate electrical breakdown and electrical static charging in the contacting area relative to mirror 102. During typical operation, the single mirror assembly 101 is actuated such that the mirror 102 contacts the landing pad 104A to ensure that at a desired angle is achieved between the mirror 102 and the base 103 so that incoming optical radiation "A" is reflected off the surface of the mirror 102 in a desired direction "B." The deflection of the mirror 102 towards the electrode 106A due to the application of voltage $V_A$ creates a restoring force $F_R$ (e.g., moment), due to the bending of the flexible member 107. The magnitude of the restoring force $F_R$ is generally defined by the physical dimensions and material properties of the flexible member 107, and the magnitude of distortion experienced by the flexible member 107. The maximum restoring force $F_R$ is typically limited by the torque applied by the electrostatic force $F_E$ that can be generated by the application of the maximum allowable voltage $V_A$. To assure contact between the mirror 102 and the landing pad 104A the electrostatic force $F_E$ must be greater than the maximum restoring force $F_R$.

As the distance between the mirror 102 and the landing pad 104A decreases, the interaction between the surfaces of these components generally creates one or more stiction forces $F_s$ that acts on the mirror 102. When the stiction forces $F_s$ equals or exceeds the restoring force $F_R$, device failure results, since the mirror 102 is prevented from moving to a different position when the electrostatic force generated by voltage $V_A$ is removed or reduced. As previously described herein, stiction forces are complex surface phenomena that generally include three major components. The first is the so-called "capillary force" that is created at the interface between a liquid and a solid due to an intermolecular force imbalance at the surface of a liquid (e.g., Laplace pressure differences) that generates an adhesive-type attractive force. Capillary force interaction in MEMS and NEMS devices usually occurs when a thin layer of liquid is trapped between the surfaces of two contacting components. A typical example is the water vapor in the ambient. The second major component of stiction forces is the Van der Waal's force, which is a basic quantum mechanical intermolecular force that results when atoms or molecules come very close to one another. When device components contact one another, Van der Waal's forces arise from the polarization induced in the atoms of one component by the presence of the atoms of the second component. When working with very planar structures, such as those in MEMS and NEMS devices, these types of stiction forces can be significant due to the size of the effective contact area. The third major component of stiction forces is the electrostatic force created by the coulombic attraction between trapped charges found in the interacting components.

Device Package Configuration(s)

Figure 3A:
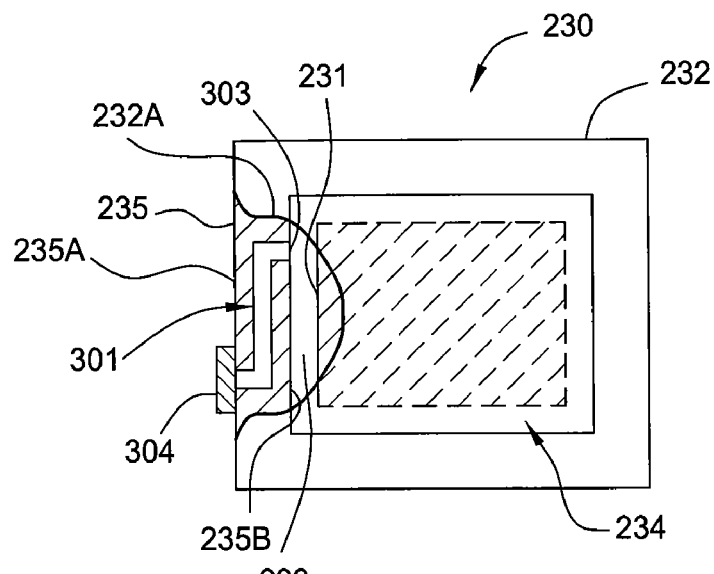
FIG. 3A illustrates a cross-sectional plan view of a device package assembly, according to one embodiment of the invention.
Figure 3B:
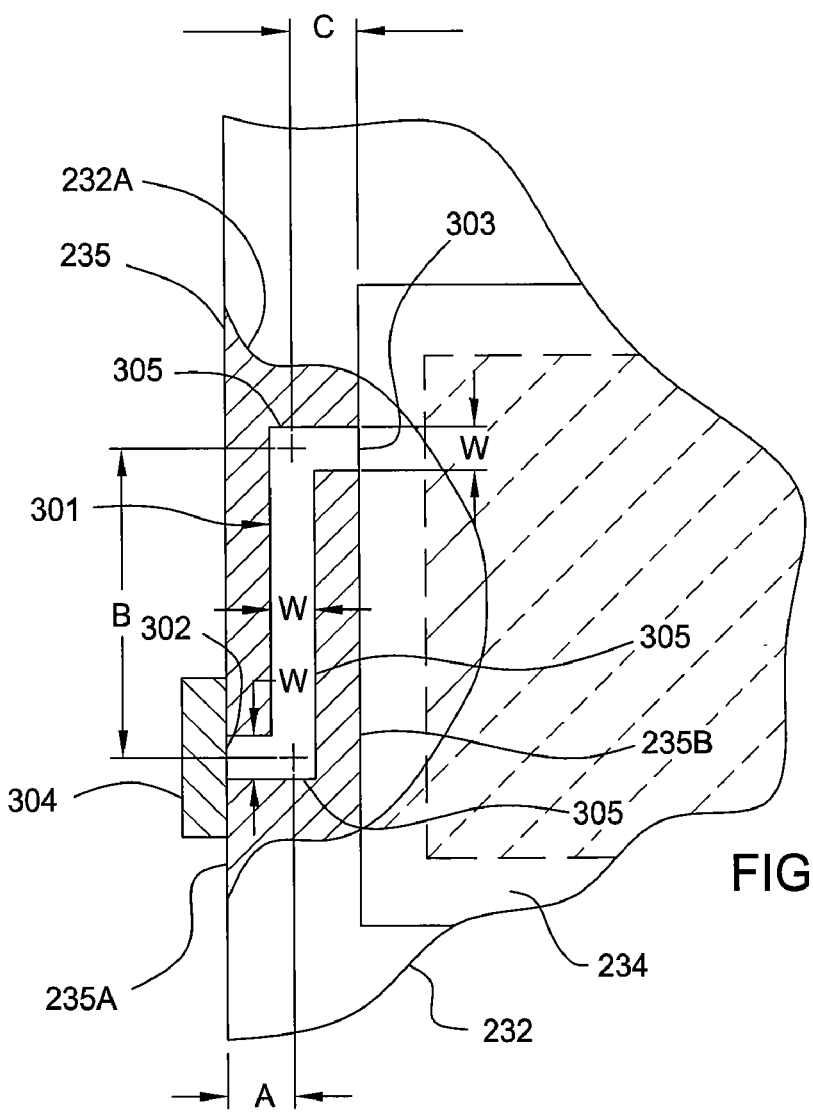
FIG. 3B illustrates a close-up of a partial section view illustrated in FIG. 3A, according to one embodiment of the invention.
Figure 3C:
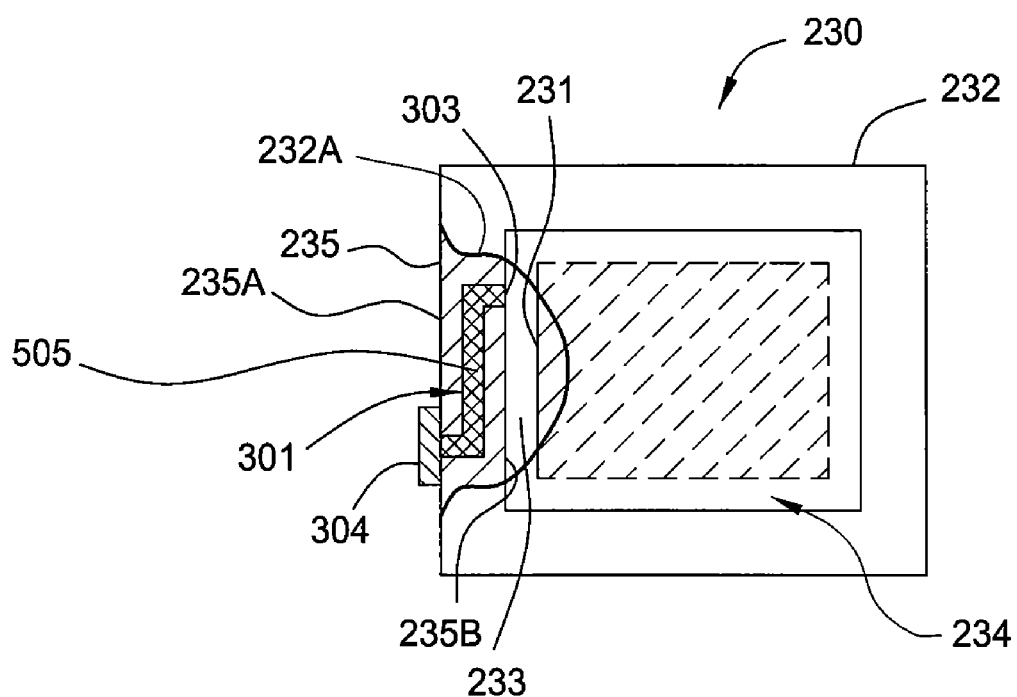
FIG. 3C illustrates a cross-sectional plan view of a device package assembly, according to one embodiment of the invention.

FIG. 3A illustrates a plan view that contains a partial section view of a lubricant channel 301 formed in the MEMS device package 230 illustrated in FIG. 2A. FIG. 3B illustrates a close-up view of the lubricant channel 301 shown in FIG. 3A. In FIGS. 3A-3D, lid 232 is cut along line 232A to expose the lubricant channel 301. The lubricant channel 301 may be formed in any one of the walls that encloses the processing region 234. In one embodiment, as shown in FIGS. 3A and 3B, the lubricant channel 301 is formed in the surface of the interposer 235 just below the lid 232. The lubricant channel 301 generally extends from an exterior surface 235A to an interior surface 235B of one of the walls that encloses the processing region 234. To prevent contamination or particles from making their way into the processing region 234 from the outside environment through the lubricant channel 301, a cap 304 is typically positioned over the channel inlet 302. The cap 304 may be a polymer, such as an epoxy or silicone, or other solid material that is bonded to the exterior surface 235A using conventional sealing techniques. While the cap 304 shown in FIGS. 3A-3C is illustrated as being attached to the exterior surface 235A of the MEMS device package 230 this configuration is not intended to be limiting as to the scope of the invention, since the cap 304 may also be positioned within the lubricant channel 301, or any other desirable position, without varying from the basic scope of the invention. While FIGS. 3-9 generally illustrate a lubricant channel 301 formed in a side wall (e.g., interposer 235) of the MEMS device package 230 this configuration is not intended to be limiting as to the scope of the invention, since the lubricant channel could, for example, be formed the lid 232 or in the base 233 (See FIGS. 3A and 6B).

The lubricant channel 301 is adapted to contain a desired amount of a lubricant material (not shown) that vaporizes or diffuses into the processing region 234 over time. The rate with which the lubricant material migrates into the processing region is set by the geometry of the lubricant channel 301, the type of lubricating material (e.g., lubricant's molecular weight), the lubricant material's bond strength to surfaces with the processing region (e.g., physisorption, chemiosorption), the capillary force created by the surface tension of the lubricant against the surfaces within the channel, the temperature of the lubricant, and pressure of volume contained within the processing region 234. Referring to FIG. 3B, the volume of the lubricant channel 301 is defined by the formed length times the cross-sectional area of the lubricant channel 301. The length of the lubricant channel 301 is the length of channel that extends from the exterior surface 235A to the interior surface 235B, such the sum of the length of segments A, B and C, as shown in FIG. 3B. In one aspect, the cross-sectional area (not shown) is defined by the depth (not shown) and width W of the lubricant channel 301 formed in one of the walls that encloses the processing region 234. In one embodiment, the width W of the lubricant channel 301 is between about 10 micrometers (μm) and about 800 μm and the depth is between about 10 micrometers (μm) and about 200 μm. In one embodiment, a lubricant channel 301 is adapted to contain a volume of lubricant between about 0.1 nanoliters (nl) and about 1000 nl. The cross-section of the lubricant channel 301 need not be square or rectangular, and can be any desirable shape without varying from the basic scope of the invention.

FIG. 3C illustrates a lubricant channel 301 that has a volume of lubricant 505 disposed therein to provide a ready supply of lubricant to the processing region 234. Therefore, during the normal operation of the MEMS device 231, molecules of the lubricant material tend to migrate to all areas within the processing region 234. The continual migration of the lubricant 505 to the areas of the MEMS device 231 where is stiction may occur is useful to prevent stiction-related failures at a contact region between two interacting MEMS components. As the lubricant molecules breakdown at the contact regions and/or adsorb onto other surfaces within the processing region 234 during operation of the device, "fresh" lubricant molecules replace the broken-down or adsorbed lubricant molecule(s), thereby allowing the deposited lubricant in the lubricant channel 301 to act as a lubricant reservoir.

The movement or migration of molecules of the lubricant 505 is generally performed by two transportation mechanisms. The first mechanism is a surface diffusion mechanism, where the lubricant molecules diffuse across the internal surface(s) of the device to reach the contact region between two interacting MEMS components. In one aspect, the lubricant molecules are selected for good diffusivity over the surfaces contained within the processing region 234. The second mechanism is a vapor phase, or gas phase, migration of the lubricant molecules stored in lubricant channel 301 to the contact region between two interacting MEMS components. In one aspect, the lubricant molecule stored in the lubricant channels 301 of the device package are selected so that they desorb from these areas and enter into the process region 234, which surrounds the MEMS device 231, as a vapor or gas. During operation of the device, the lubricant molecules reach an equilibrium partial pressure within processing region 234 and then, in a vapor or gaseous state, migrate to an area between the interacting surfaces.

Since these two types of transport mechanisms tend to aid in the building up of a lubricant layer, which reduces the interaction of the moving MEMS components, the act of delivering lubricant to an exposed region of the MEMS device is generally referred to hereafter as "replenishment" of the lubricant layer, and the migrating lubricants by either transportation mechanism are referred to as a "mobile lubricant". Generally, a sufficient amount of replenishing lubricant molecules are stored inside the lubricant channels 301 so that the enough lubricant molecules are available to prevent stiction type failures at the interacting areas of the MEMS device during the entire life cycle of the product.

Figure 3D:
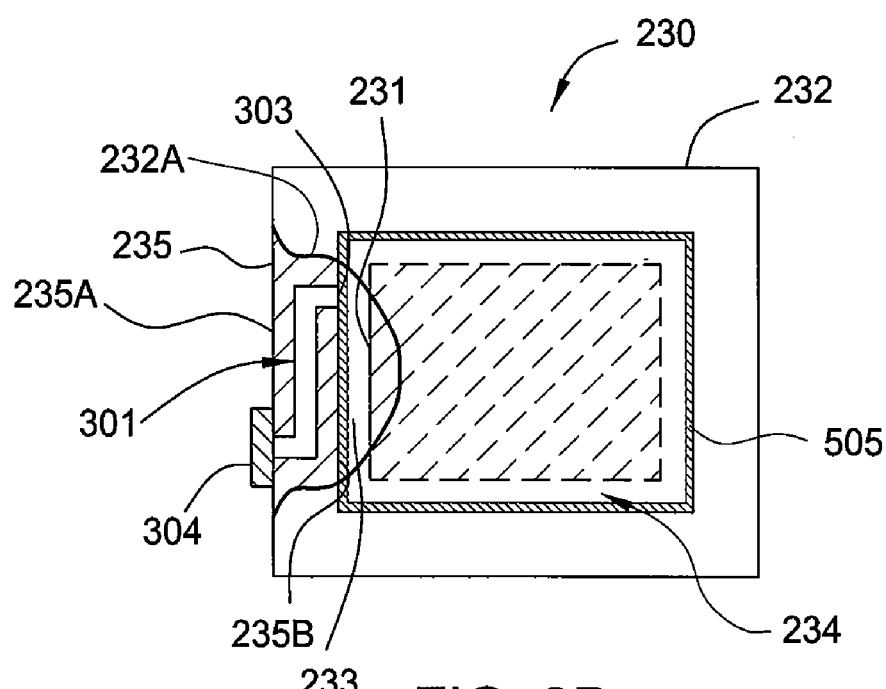
FIG. 3D illustrates a cross-sectional plan view of a device package assembly, according to one embodiment of the invention.

In one embodiment, illustrated in FIG. 3D, the size of the lubricant channel is selected so that the surface tension of a liquid lubricant against the surfaces of the lubricant channel 301 causes the lubricant material to be drawn from a position outside of the MEMS device package 230 into lubricant channel 301 and then into the processing region 234. In this way the lubricant channel acts as a liquid injection system that allows the user to deliver an amount of the lubricant material 505 into the processing region 234, by use of the capillary force(s) created when the lubricant contacts the walls of the lubricant channel. In one example, the width W of the lubricant channel 301 is between about 100 micrometers (μm) and about 600 μm and the depth is between about 100 micrometers (μm) ±50 μm. When in use, the capillary force(s) can be used to deliver an amount of lubricant that is smaller or larger than volume of the channel 301. In this configuration it may be possible to deliver different volumes of two or more different lubricants through the same lubricant channel 301, or to transmit one type of lubricant through the channel first and retain another type of lubricant in the lubricant channel in a subsequent step.

In another embodiment, the lubricant 505 is selected so that a portion of the lubricant vaporizes to form a vapor, or gas, within the processing region during normal operation of the device. In cases where the MEMS device is a spatial light modulator (SLM), typical device operating temperatures may be in a range between about 0° C. and about 70° C. It should be noted that the ability of the lubricant to form a vapor or gas is dependent on the lubricant's equilibrium partial pressure which varies as a function of the temperature of the lubricant, the pressure of the region surrounding the lubricant, the lubricant material's bond strength to surfaces with the processing region (e.g., physisorption, chemiosorption), and its molecular weight. In another embodiment, the lubricant is selected due to its ability to rapidly diffuse along the surfaces within the processing region 234.

In another embodiment, the lubricant is adapted to operate at a temperature that is within an extended operating temperature range, which is between about 0° C. and about 70° C. In yet another embodiment, the lubricant is selected so that it will not decompose when the device when exposed to temperatures between about −30° C. and about 400° C., which are the temperatures that may be experienced during a typical MEMS or NEMS packaging process.

Examples of lubricants 505 that may be disposed within a lubricant channel 301 and used to prevent stiction of the interacting components within a MEMS device are perfluorinated polyethers (PFPE), a self assembled monolayer (SAM), or other liquid lubricants. Some known types of PFPE lubricants are Y or Z type lubricants (e.g., fomblin Z25) available from Solvay Solexis, Inc. of Thorofare, N.J., Krytox® (e.g., perfluoroalkylethers) from DuPont, and Demnum from Daikin Industries, LTD. Examples of SAM include dichlordimethylsilane ("DDMS"), octadecyltrichlorsilane ("OTS"), perfluoroctyltrichlorsilane ("PFOTCS"), perfluorodecyl-trichlorosilane ("FDTS"), fluoroalkylsilane ("FOTS").

In alternative embodiments, it may be desirable to modify the properties of the surfaces within the lubricant channel 301 to change the lubricant material's bond strength to surfaces with the internal region 305 of the lubricant channel 301 (e.g., physisorption, chemiosorption). For example, it may be desirable to coat the surfaces of the lubricant channel 301 with an organic passivating material, such as a self-assembled-monolayer (SAM). Useful SAM materials include, but are not limited to, organosilane type compounds such as octadecyltrhichlorosilane (OTS), perfluorodecyltrichlorosilane (FDTS). The surfaces of the lubricant channel 301 may also be modified by exposing them to microwaves, UV light, thermal energy, or other forms of electromagnetic radiation.

As noted above, conventional techniques that require the addition of a reversibly absorbing getter to MEMS device package to retain the lubricating materials, substantially increases the device package size, the complexity of forming the device and also adds steps to the fabrication process. Such device package designs have an increased piece-part cost and an increased overall manufacturing cost, due to the addition of extra getter components. Therefore, by disposing a mobile lubricant material in a lubricant channel formed in or on one or more of the walls that enclose the processing region an inexpensive and reliable MEMS device can be formed. The use of the lubricant channel 301 eliminates the need for a reversibly adsorbing getter and thus reduces the device package size, the manufacturing cost and the piece-part cost. The embodiments described herein also improve device yield and device reliability by reducing the likelihood that external components positioned within the processing region, such as getter materials, contact the moving or interacting components within the formed device package during operation.

Lubricant Channel Formation Process

In general the lubricant channel 301 can be formed in one or more of the walls of an enclosure that contains a MEMS or any other stiction affected device, as illustrated above. Typically, MEMS components are enclosed in a MEMS device package 203 using a chip-level packaging process or wafer-level packaging process. An example of a chip-level packaging process can be found in U.S. Pat. No. 5,936,758 and US Patent Publication No. 20050212067. The embodiments of the described below have a particular advantage over conventional MEMS device packaging processes, since they eliminate the requirement that the lubricating material be exposed to a high temperature during the steps used to form the sealed processing region 234. Wafer level hermetic packaging processes are generally useful, since they reduce the number of steps that need to be completed in a clean room environment, as well as reduce the cost to fabricate a device.

While the discussion below focuses on a wafer level packaging method, the techniques and general process sequence need not be limited to this type of manufacturing process. Therefore, the embodiments of the invention described herein are not intended to limit the scope of the present invention. Examples of exemplary device packages 200 and processes of forming the device packages that may be used with one or more embodiments of the invention described herein are further described in the following commonly assigned U.S. patent application Ser. No. 10/693,323, filed Oct. 24, 2003, U.S. patent application Ser. No. 10/902,659, filed Jul. 28, 2004, and U.S. patent application Ser. No. 11/008,483, filed Dec. 8, 2004.

Figure 4:
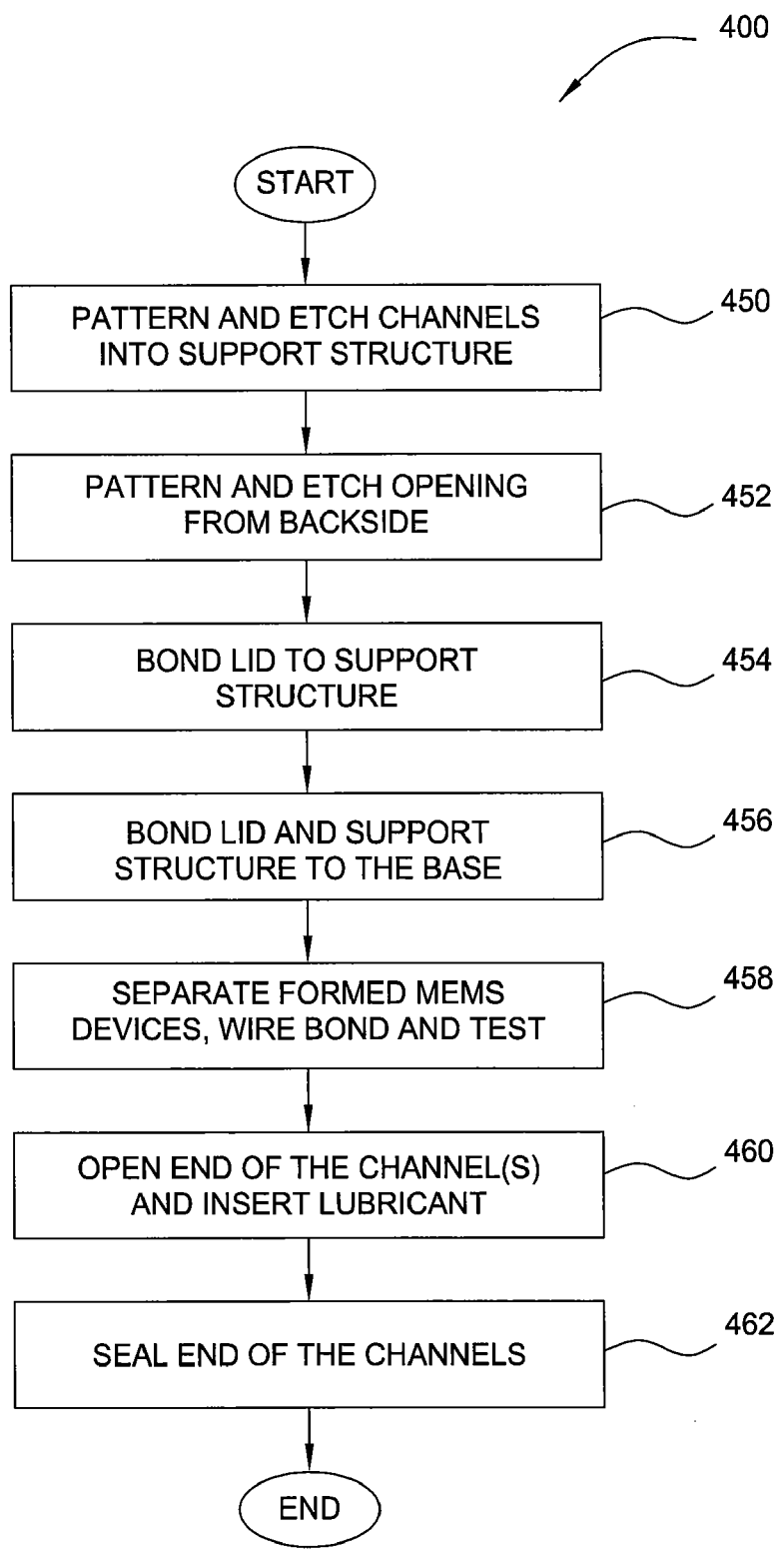
FIG. 4 is a flow diagram of process steps for forming one or more channels in a MEMS device package assembly that may be used to deliver lubricant internally to the device package, according to one embodiment of the invention.
Figure 5A:
FIG. 5A illustrates the state of one or more of the components in a MEMS device package after performing a step in the process sequence illustrated in FIG. 4, according to one embodiment of the invention.

FIG. 4 illustrates a process sequence 400 for forming a MEMS device package 203 that include lubrication channels 301, according to one embodiment of the invention. FIGS. 5A-5F illustrate the various states of one or more of the components of the MEMS device package 230 after each step of process sequence 400 has been performed. FIG. 5A is a cross sectional view of a wafer substrate 235C that may be used to form the multiple MEMS device (chip) packages 230 (FIG. 5F). The wafer substrate 235C may be formed from a material such as silicon (Si), a metal, a glass material, a plastic material, or suitable material.

Figure 5B:
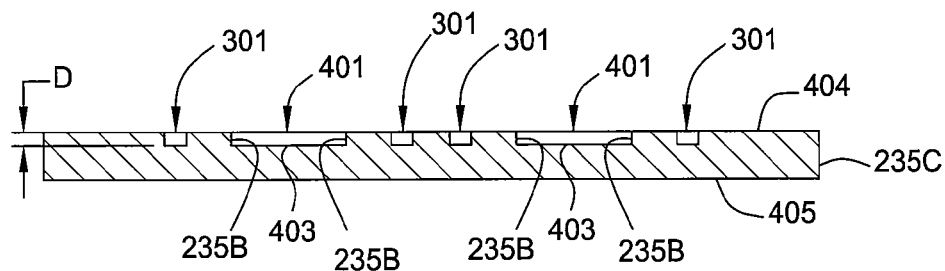
FIG. 5B illustrates the state of one or more of the components in a MEMS device package after performing a step in the process sequence illustrated in FIG. 4, according to one embodiment of the invention.

Referring now to FIGS. 4 and 5B, in step 450, conventional patterning, lithography and dry etch techniques are used to form the lubricant channels 301 and the optional depressions 401 on a top surface 404 of the wafer substrate 235C. The depth D of the lubricant channels 301 and the depressions 401 are set by the time and etch rate of the conventional dry etching process performed on the wafer substrate 235C. It should be noted that the lubricant channels 301 and depressions 401 may be formed by other conventional etching, ablation, or other manufacturing techniques without varying from the scope of the basic invention.

Figure 5C:
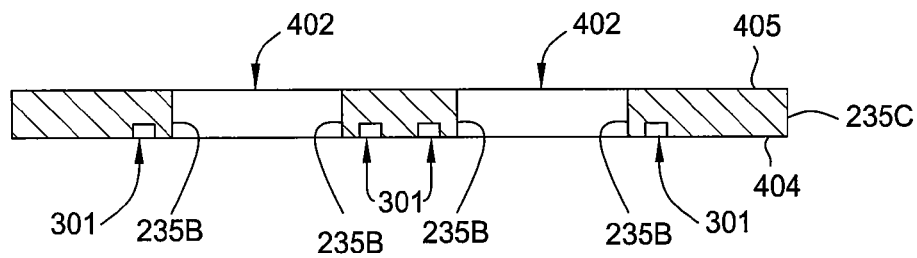
FIG. 5C illustrates the state of one or more of the components in a MEMS device package after performing a step in the process sequence illustrated in FIG. 4, according to one embodiment of the invention.
Figure 5D:
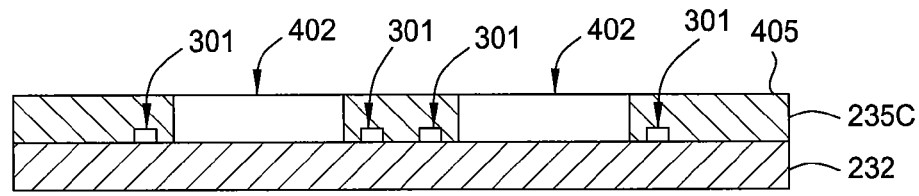
FIG. 5D illustrates the state of one or more of the components in a MEMS device package after performing a step in the process sequence illustrated in FIG. 4, according to one embodiment of the invention.
Figure 5E:
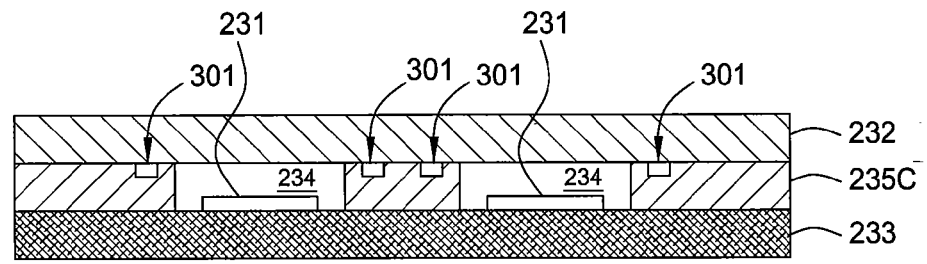
FIG. 5E illustrates the state of one or more of the components in a MEMS device package after performing a step in the process sequence illustrated in FIG. 4, according to one embodiment of the invention.
Figure 5F:
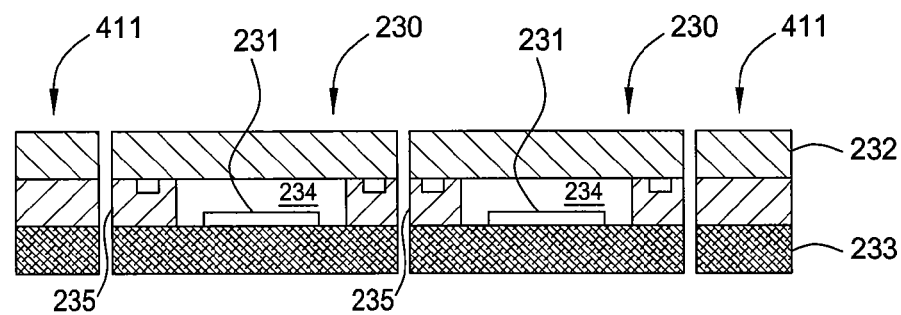
FIG. 5F illustrates the state of one or more of the components in a MEMS device package after performing a step in the process sequence illustrated in FIG. 4, according to one embodiment of the invention.

Referring now to FIGS. 4 and 5C, in step 452, conventional patterning, lithography and dry etch techniques are used to remove material from the back surface 405 (shown in FIG. 5B) until it breaks through the base wall 403 (shown in FIG. 5B) of the depressions 401 (shown in FIG. 5B) to form a through hole 402 that defines the interior surface 235B, which eventually surrounds a portion of the processing region 234 and the MEMS device 231 in the MEMS device package 230, as shown in FIG. 5F. The process of removing material from the wafer substrate 235C to form the through hole 402 may also be performed by conventional etching, ablation, or other similar manufacturing techniques.

In step 454, as shown in FIGS. 4 and 5D, the lid 232 is bonded to the top surface 404 (shown in FIG. 5C) of the wafer substrate 235C to enclose the lubricant channels 301 and cover one end of the through hole 402. Typical bonding processes may include anodic bonding (e.g., electrolytic process), eutectic bonding, fusion bonding, covalent bonding, and/or glass frit fusion bonding processes. In one embodiment, the lid 232 is a display grade glass material (e.g., Corning® Eagle 2000™) that is a bonded to the wafer substrate 235C, which is made from a silicon containing material, by use of a conventional anodic bonding technique. Typically the temperature of the at least one or more of the components in the MEMS device package reaches between about 350° C. and about 450° C. during a conventional anodic bonding process. Additional information related to the anodic bonding process is provided in the commonly assigned U.S. patent application Ser. No. 11/028,946, filed on Jan. 3, 2005, which is herein incorporated by reference in its entirety.

In step 456, as shown in FIGS. 4 and 5E, the base 233, which has a plurality of MEMS devices 231 mounted thereon, is bonded to the back surface 405 (shown in FIG. 5D) of the wafer substrate 235C to form an enclosed processing region 234 in which the MEMS device 231 resides. Typically, the base 233 is bonded to the wafer substrate 235C using an anodic bonding (e.g., electrolytic process), eutectic bonding, fusion bonding, covalent bonding, and/or glass frit fusion bonding process. In one embodiment, the base 233 is silicon containing substrate that is bonded to the silicon containing wafer substrate 235C using a glass frit bonding process. Typically, the temperature of at least one or more of the components in the MEMS device package reaches a temperature between about 350° C. and about 450° C. during a glass frit bonding process. Additional information related to the glass frit bonding process is provided in the commonly assigned U.S. patent application Ser. No. 11/028,946, filed on Jan. 3, 2005, which has been incorporated by reference in its entirety.

Referring now to FIGS. 4 and 5F, in step 458, the lid 232, wafer substrate 235C and base 233 are separated by use of a conventional dicing technique to form multiple MEMS device packages 230. The excess or scrap material 411, which is leftover after the dicing process, may then be discarded. As part of step 458, conventional wire bonding and simple tests can be performed on the formed MEMS device to assure it viability and prepare it for use in a system that may utilize the MEMS device package 230. Other dicing techniques can also be used to first expose the bond pads to allow wafer level probing and die sorting, followed by a full sigulation.

Figure 6A:
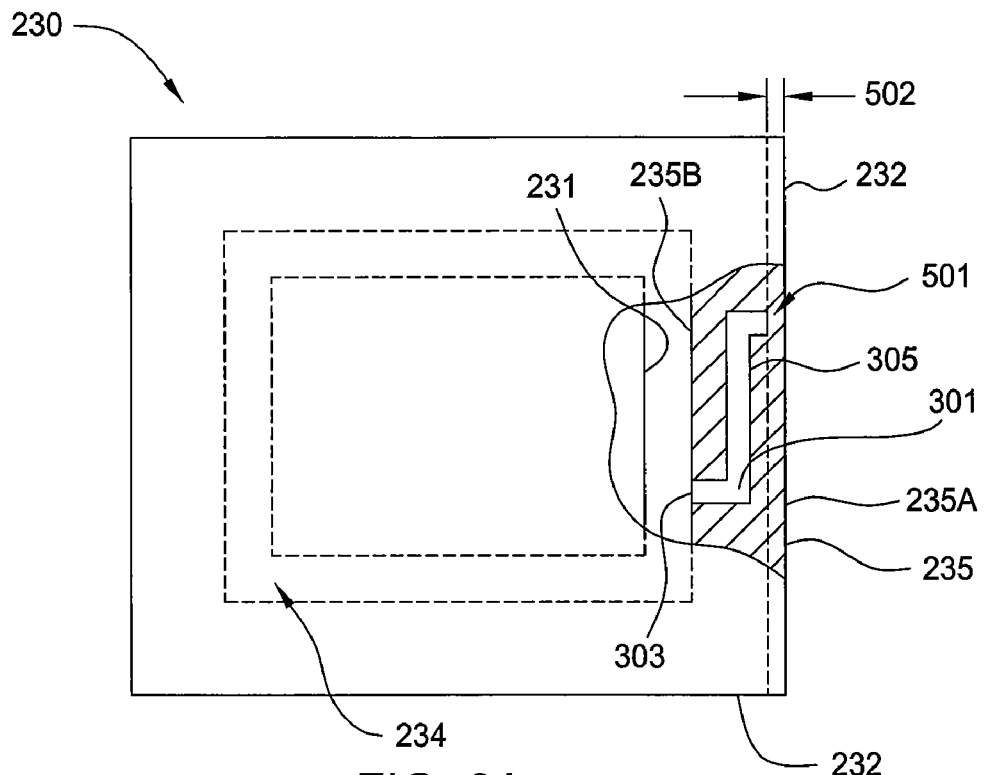
FIG. 6A illustrates a cross-sectional plan view of a device package assembly after performing multiple steps in the process sequence illustrated in FIG. 4, according to one embodiment of the invention.

FIG. 6A is a plan view of a MEMS device package 230 that contains a partial section view of a partially formed lubricant channel 301 that may be formed using process steps 450 through step 458 shown in FIG. 4. As shown, the lubricant channel 301 is only partially formed in the interposer 235 so that the end of the lubricant channel 301 that is closest to the exterior surface 235A is blocked by the excess interposer material 501 that has a material thickness 502. In general, the excess interposer material thickness 502 can be rather thin to allow for easy removal of this excess interposer material 501 and may be about 10 micrometers (μm) to about 1 mm in thickness. In this configuration, the formed lubricant channel 301 extends from the exit port 303 formed in the interior surface 235B to the opposing end that is blocked by the excess interposer material 501. In this way the processing region 234 and MEMS device remain sealed until the excess interposer material 501 is removed so that the lubricant material can be injected within the lubricant channel 301 during the step 460 of FIG. 4 as described below.

Figure 6C:
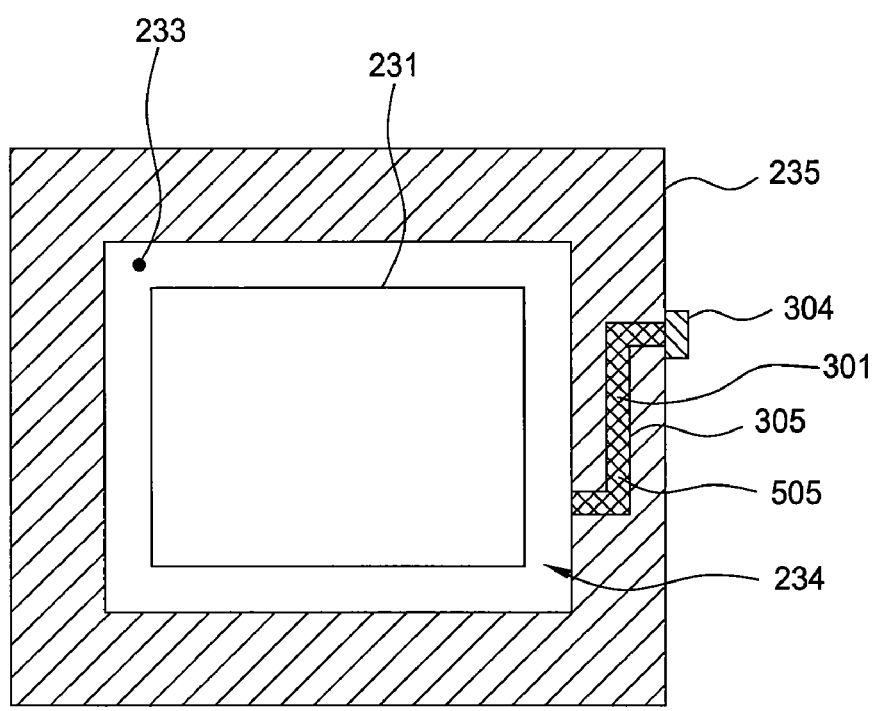
FIG. 6C illustrates a cross-sectional plan view of a device package assembly after performing multiple steps in the process sequence illustrated in FIG. 4, according to one embodiment of the invention.
Figure 6B:
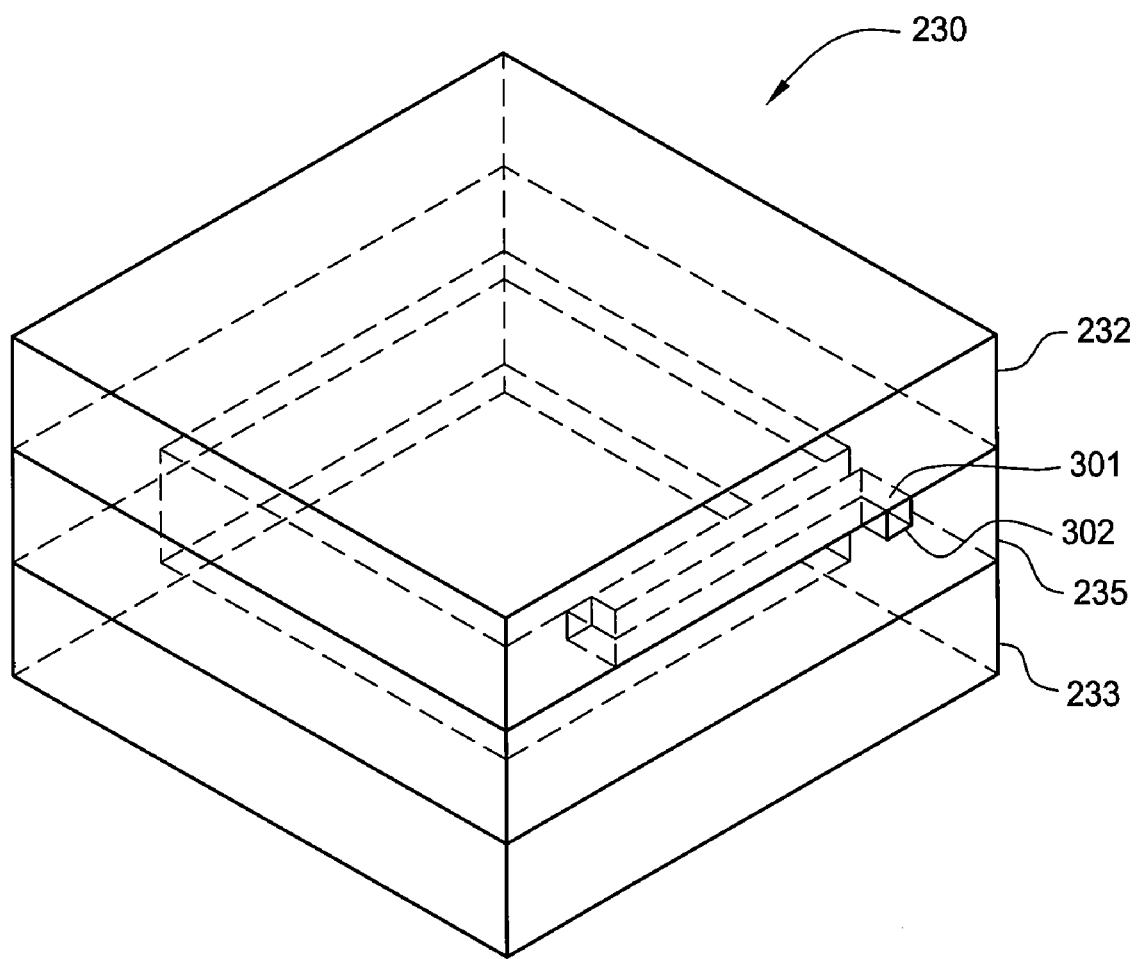
FIG. 6B illustrates an isometric view of a device package assembly after performing multiple steps in the process sequence illustrated in FIG. 4, according to one embodiment of the invention.

Referring to FIGS. 4 and 6B, in step 460 of the process sequence 400, the excess interposer material 501 is removed to expose the channel inlet 302. The excess interposer material 501 may be removed by a step of puncturing the obstructing material or by performing a conventional abrasive, grinding or polishing technique. After the channel inlet 302 is exposed a lubricant 505 as shown in FIG. 6C, is injected into the lubricant channel using a syringe or other similar device. In one aspect, it may be desirable to clean and remove any particles from the lubricant channel 301 created when the excess interposer material is removed to assure that particles cannot make their way into the processing region 234.

In one embodiment, the processing region 234 is filled with a gas during the MEMS device package formation process to a pressure that is greater than atmospheric pressure so that any particles created during the removal of the excess interposer material 501 are urged away from the processing region 234 by the escaping gas. In one aspect, the processing region 234 is filled with a gas to a pressure higher than atmospheric pressure during the process of bonding the base 233 to the back surface 405 of the wafer substrate 235C, in step 456 as discussed above. In this case the environment in which step 456 is performed is maintained at a pressure higher than atmospheric pressure so that an amount of the high pressure gas is trapped in the formed processing region 234. The gas retained in the processing region 234 may be an inert gas, such as nitrogen or argon.

Referring to FIGS. 4 and 6C, in step 462, the cap 304 is installed over the channel inlet 302 to isolate the environment external to the MEMS device package 230 from the lubricant 505 disposed in the lubricant channel 301 and the processing region 234. As noted above, the cap 304 may be a polymer, such as an epoxy or silicone, or other solid material, such as a glass frit or metal that is bonded to exterior wall of the MEMS device package 230. A spot welding method such as laser weld can also be employed to seal the opening.

In an alternative embodiment, the lubricant channel 301 is formed so that the contents of the lubricant channel 301 can be viewed through an optically transparent wall that encloses the processing region, such as the lid 232. In this configuration, the lubricant channel 301 is formed in the surface of the lid 232 or the surface of the interposer 235, so that the contents of the lubricant channel 301 can be viewed through the optically transparent lid 232. This configuration is useful since it allows the user to inspect the contents of the lubricant channel 301 to see how much lubricant 505 is left in the lubricant channel 301 so that corrective measures can be taken if necessary.

One advantage of the embodiments of the invention described herein relate to the general sequence and timing of delivering the lubricant 505 to the formed MEMS device package 230. In general, one or more embodiments of the invention described herein, provide a sequence where the lubricant 505 is delivered into the processing region after all of the high temperature MEMS device packaging processes have been performed, thereby reducing or preventing the premature breakdown of the lubricant material due to the high temperature bonding processes (e.g., anodic bonding, glass frit bonding) where the temperature may reach 350° C. to 450° C. The ability to place the lubricant 505 into the lubricant channel 301 and processing region 234 after performing the high temperature bonding steps allows one to select a lubricant material that would degrade at the typical bonding temperatures and/or reduce the chances that the lubricant material will breakdown or be damaged during the MEMS device forming process. One skilled in the art will also appreciate that a lubricant channel 301 formed in a MEMS device package using a chip level packaging process versus a wafer level packaging process benefits from the delivery of the lubricant 505 after the MEMS device package sealing processes (e.g., anodic bonding, TIG welding, e-beam welding) are performed.

Another advantage of the embodiments of the invention described herein relate to the reduced number of processing steps required to form a MEMS device package and the reduced number of steps that need to be performed in a clean room environment. Conventional MEMS device fabrication processes that utilize a reversibly absorbing getter require the additional steps of 1) bonding the getter material to a surface of the lid or other component prior to forming a sealed MEMS device package, and 2) heating the package to activate the getter device. The removal of these steps reduces the number of process sequence steps that need to performed in a clean room environment and reduce the cost of forming the MEMS device.

Lubricant Channel Configurations

Figure 7A:
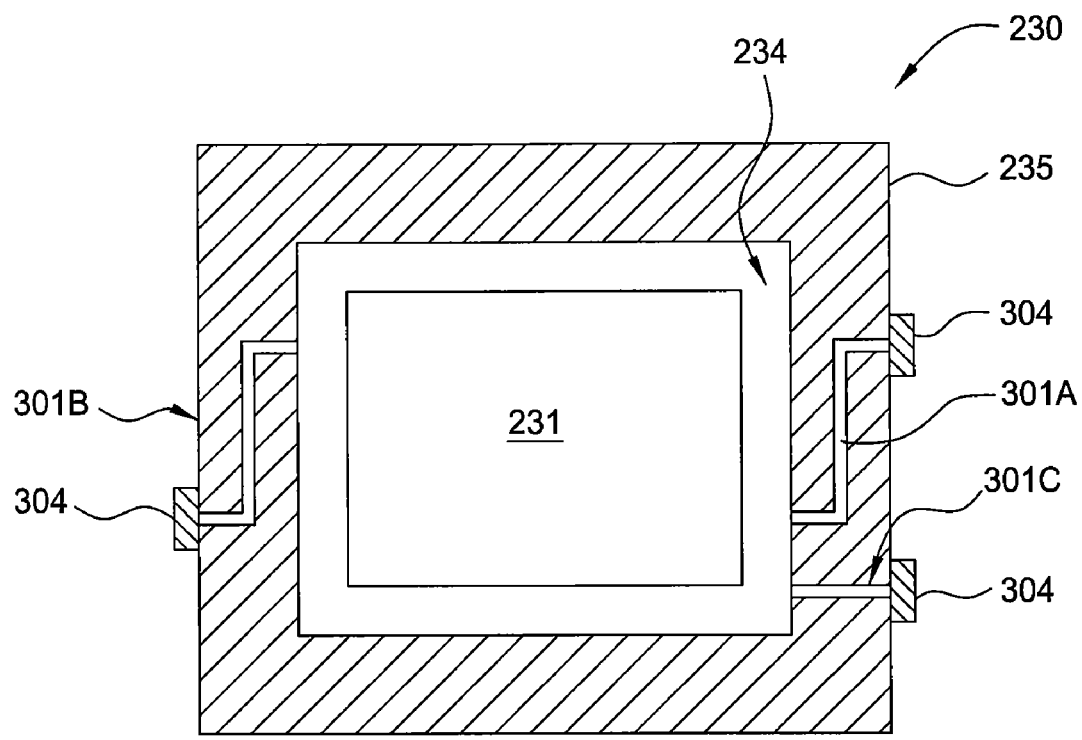
FIG. 7A illustrates a cross-sectional plan view of a device package assembly, according to one embodiment of the invention.

While the preceding discussion only illustrates a MEMS device package that has a single lubricant channel to deliver the lubricant material to the processing region 234, it may be advantageous to form a plurality of lubricant channels 301 having different geometric characteristics and positions within the MEMS device package 230 to better distribute the mobile lubricant within the MEMS package. The geometric attributes of each lubricant channel can also be used to deliver differing amounts of mobile lubricants at different stages of the products lifetime. FIG. 7A is a cross-sectional plan view of a MEMS device package 230 that has multiple lubricant channels 301A-301C that are formed having differing lengths, shapes and volumes. In one aspect, it is desirable to uniformly distribute the lubricant channels, such as lubricant channels 301A and 301B, in different areas of the MEMS device package 230 so that the distribution of lubricant molecules from the lubricant channels is relatively uniform throughout the MEMS device package. In one case, the length of the lubricant channels 301A and 301C may be adjusted to reduce the manufacturing cost or optimize the volume of lubricant contained within the lubricant channel.

In one embodiment, it may be desirable to form a plurality of lubricant channels that each deliver or contain a different lubricant material having different lubricating properties and/or migration properties. For example, a first type of mobile lubricant molecule could be transported through or stored in the lubricant channel 301A and a second type of mobile lubricant molecule could be transported through or stored in the lubricant channel 301B, where the first and second mobile lubricant molecules each have a different equilibrium partial pressures during normal operation of the device and/or each lubricant has a different migration rate throughout the package. In one aspect, it may be desirable to tailor the geometry and volume of the lubricant channel(s) to correspond to the type of lubricant processed within them.

Figure 7B:
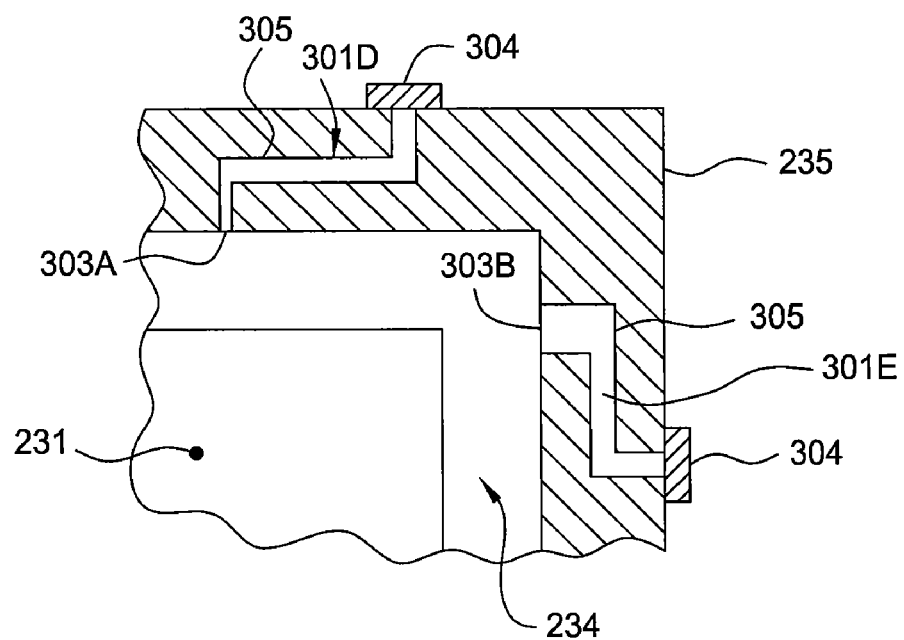
FIG. 7B illustrates a close-up of a partial section view of a device package assembly, according to one embodiment of the invention.

FIG. 7B is a cross-sectional view of a wall containing two lubricant channels 301D and 301E that have an exit port 303A or 303B that have a differing geometry to control the rate of lubricant material migrating into the processing region. As shown, it may be desirable to have a first lubricant channel 301D that has an exit port 303A that has a small cross-sectional area to reduce the diffusion and/or effusion of lubricant material into the processing region 234, and a second lubricant channel 301E that has an exit port 303B that has a large cross-sectional area to allow for a rapid diffusion and/or effusion of lubricant material into the processing region 234. When these two configurations are used in conjunction with each other, the second lubricant channel 301E can be used to rapidly saturate the surfaces within the processing region 234 during the startup of the MEMS device. However, the first lubricant channel 301D can be used to slowly deliver "fresh" lubricant material to the processing region 234 throughout the life of the device.

Figure 7C:
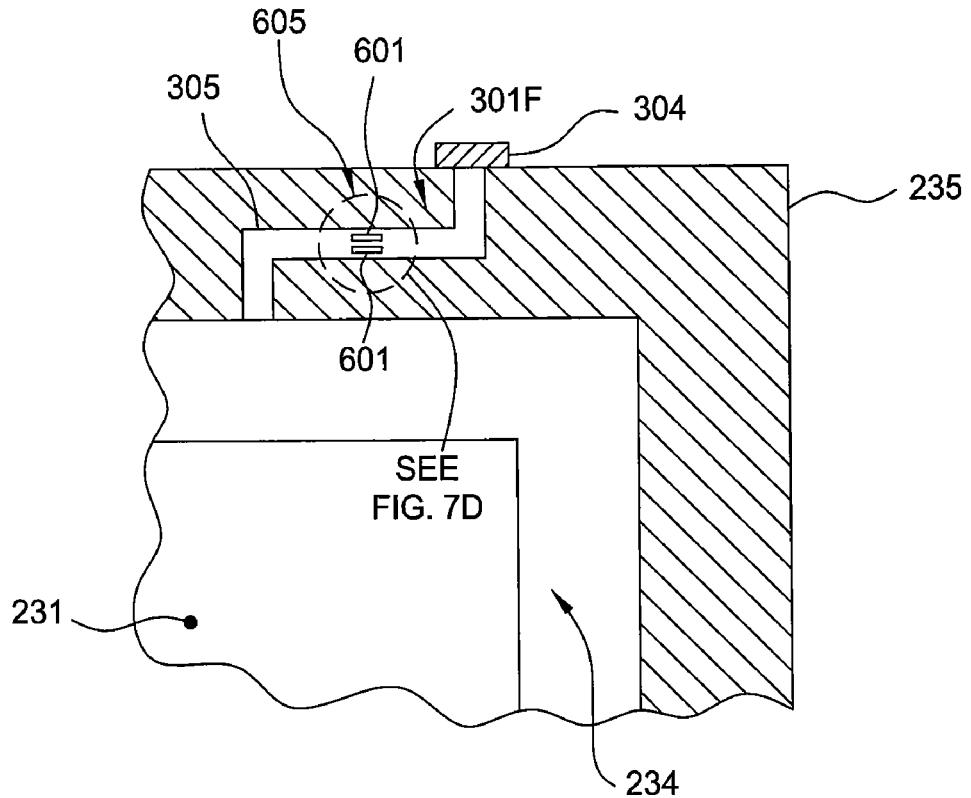
FIG. 7C illustrates a close-up of a partial section view of a device package assembly, according to one embodiment of the invention.
Figure 7D:
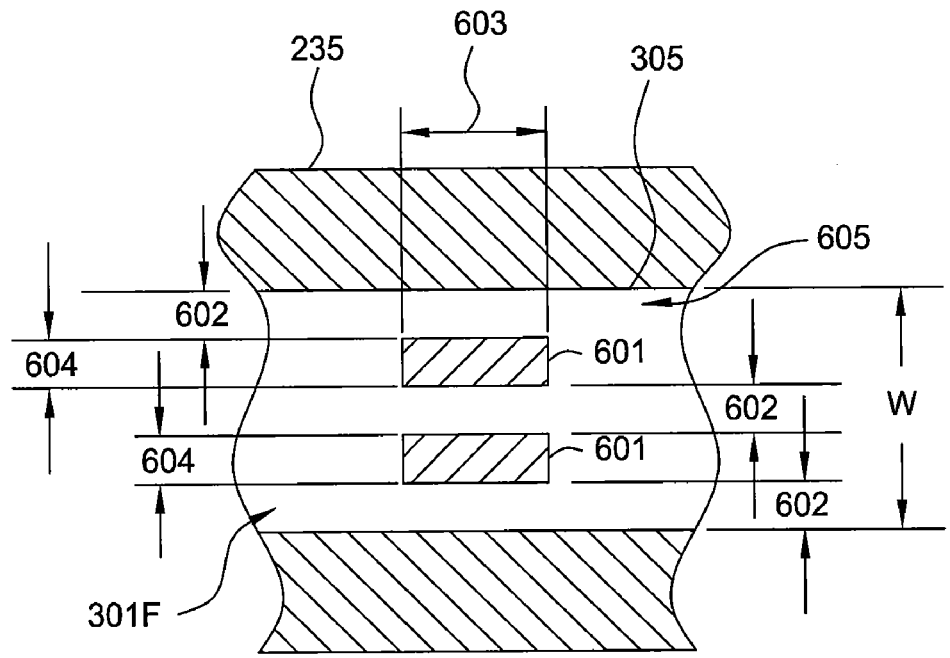
FIG. 7D illustrates a close-up of a partial section view illustrated in FIG. 7C, according to one embodiment of the invention.

FIGS. 7C and 7D illustrates another embodiment of a lubricant channel 301F that contains a filter region 605 that contains a plurality of obstructions 601 that are used to minimize the influx of a particles of a certain size into the processing region 234 from the environment outside the MEMS device package 230. The obstructions 601 are generally configured to have a desired length 603, width 604 and height (not shown) and have a desired spacing 602 between each of the obstructions 601, and thus act as a sieve to prevent the influx of particles of a certain size into the processing region 234. The obstructions 601 may be formed in the lubricant channel 301F using conventional patterning, lithography and dry etch techniques during the process of forming the lubricant channel 301F. Generally, the width W of lubricant channel 301F and the orientation of the obstructions 601 disposed in the lubricant channel 301F are configured to maximize the in flux of the lubricant into the processing region. Generally, it is desirable to select the number, orientation of the obstructions 601, and the space 602 and depth (not shown; i.e., into the page of FIG. 7D) of the spaces 602 between the obstructions 601 so that a particle of desired size is not be able to make it into the processing region 234 and cause damage to the MEMS devices disposed therein. In one embodiment, the obstructions 601 has a length between about 50 µm and about 200 µm, a width between about 1 µm and about 50 µm, and a space 602 is between about 1 µm and about 20 µm. In one example, the depth of the spaces 602 may be the same as the depth of the channel.

In another embodiment, the lubricant channel 301F contains a number of arrays of obstructions 601 that are staggered relative to each other along a portion of the length of the lubricant channel 301F. In another embodiment, multiple groups of obstructions 601, or multiple filter regions 605, are placed in different areas of the lubricant channel to further prevent particles from entering the processing region of the formed device. For example, it may be desirable to have one filter region 605 near the inlet of the lubricant channel to collect particles that may enter from outside of the MEMS device package and another filter region 605 positioned in the lubricant channel near the processing region that acts as a final filtration device before entering the processing region.

Figure 7E:
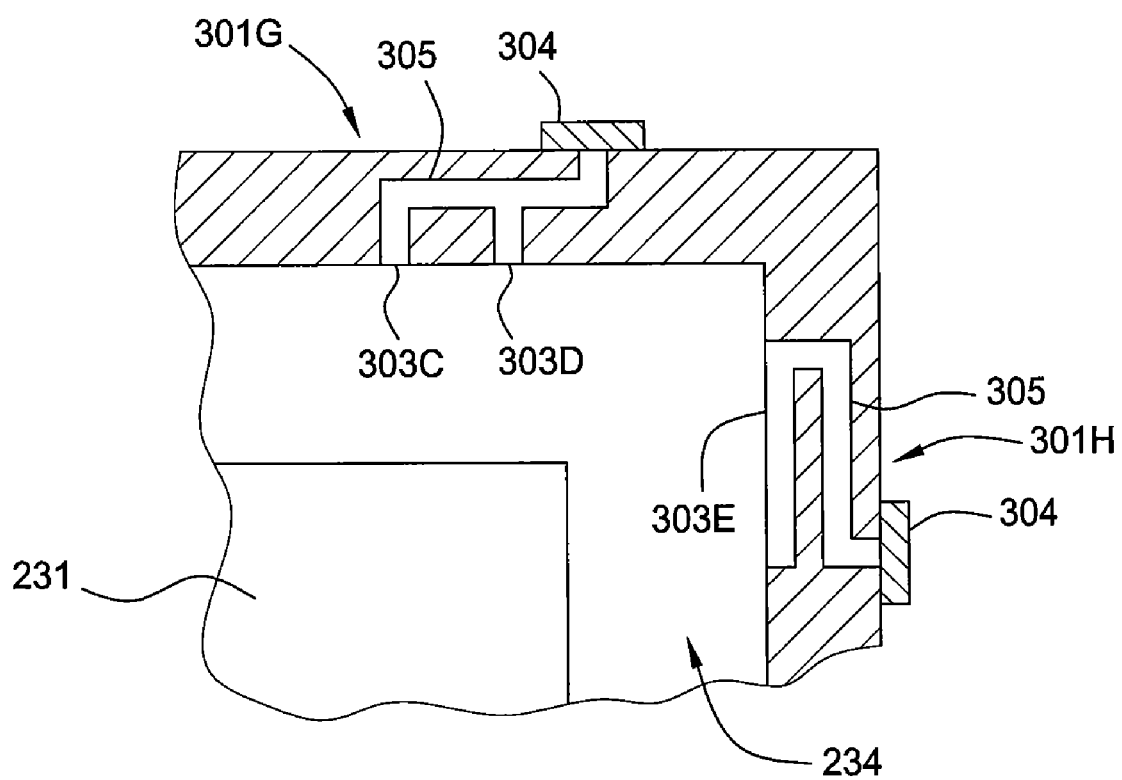
FIG. 7E illustrates a close-up of a partial section view of a device package assembly, according to one embodiment of the invention.

FIG. 7E is a cross-sectional view of a wall containing two lubricant channels that have differing exit port configurations that may be useful to enhance the distribution or delivery of the lubricant to the processing region 234. In one embodiment, a lubricant channel 301G has multiple outlets (e.g., exit ports 303C-303D) that are adapted to improve the rate of delivery of the lubricant to the processing region and/or improve the distribution of lubricant to different areas of the processing region. In another embodiment, the lubricant channel 301H has a large exit port 303E that acts a nozzle, which promotes the delivery of lubricant to the processing region 234.

Figure 8:
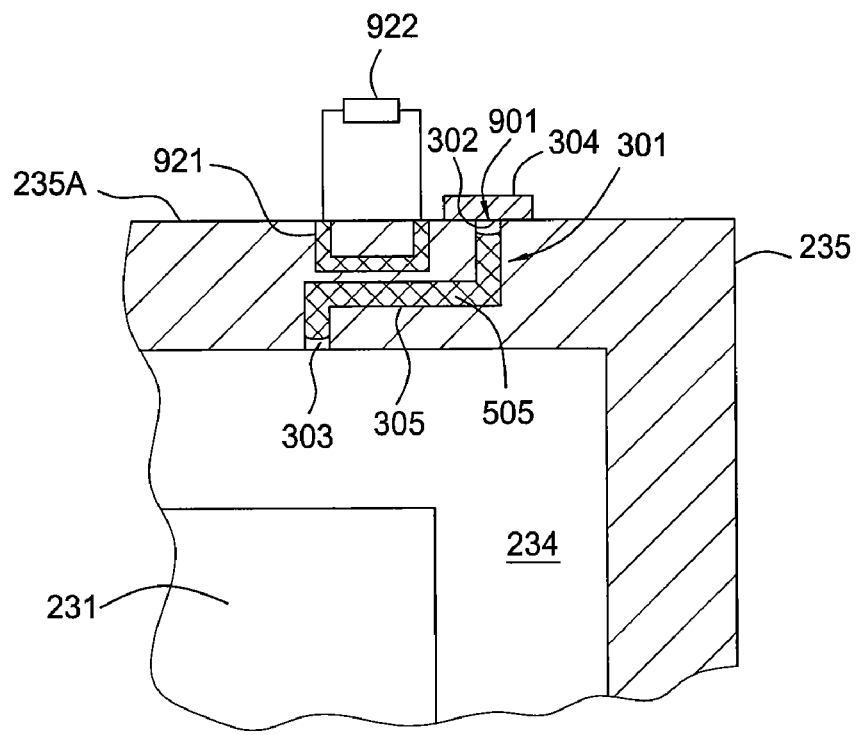
FIG. 8 illustrates a close-up of a partial section view of a device package assembly, according to one embodiment of the invention.

In another embodiment, as shown in FIG. 8, the temperature of the lubricant contained in the lubricant channel 301 may be controlled using a resistive element 921 and a temperature controller 922. In this configuration, the controller 922 is adapted to deliver a desired amount of current or apply a desired voltage across the resistive elements 921 to control the temperature of the lubricant disposed in the lubricant channel 301, and thus control the rate of lubricant migration to the processing region 234. In another aspect, the resistive element 921 is mounted on the exterior surface 235A of one of the walls that encloses the processing region 234, so that it is able to control the temperature of the lubricant disposed within a lubricant channel 301. In one aspect, the resistive element 921 is a metal foil that is deposited on a surface of one of the walls that encloses the processing region 234. One should note that the migration rate of the lubricant from the lubricant channel 301 is strongly dependent on the temperature of the lubricant, since vaporization and diffusion are both thermally activated processes.

In one embodiment, a volume of gas 901 may be purposely injected into the lubricant channel 301 prior to covering the injection port 302 with the cap 304 to provide a buffer and a temperature compensating mechanism that controls the rate of delivery to the processing region 234. In this configuration, the volume of gas 901 expands as the temperature increases, which causes the lubricant disposed in the lubricant channel 301 to be pushed towards the exit port 303, and retract when the temperature in the lubricant channel 301 drops. This may be useful in cases where the lubricant breaks down more rapidly as the temperature in the processing region increases. In one embodiment, where the lubricant is a viscous liquid and/or has a strong adhesion to the lubricant channel 301 surfaces the volume of gas 901 may be added at a pressure that is just slightly higher than the pressure in the processing region 234, which allows the gas to slowly deliver the lubricant to the processing region as the volume of gas expands to compensate for the pressure difference.

Figure 9:
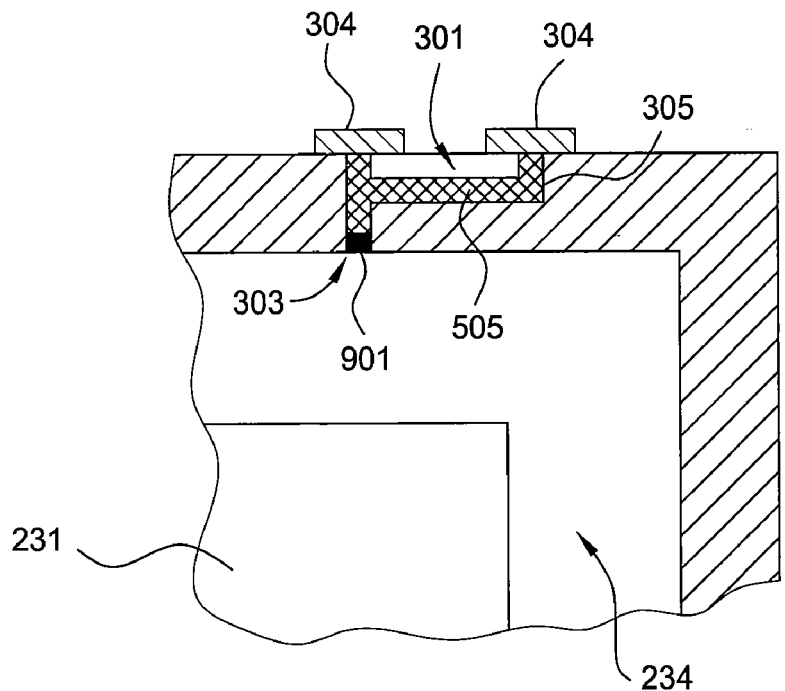
FIG. 9 illustrates a close-up of a partial section view of a device package assembly, according to one embodiment of the invention.

In one embodiment, as shown in FIG. 9, a cap 304 may be inserted at the exit port 303 to isolate the fluid channel 301 from the processing region 234, until it is desirable to remove the cap 304 to allow the lubricant 505 to enter the processing region 234. In one aspect, the cap 304 is a polymer, such as a photoresist, that remains in place over the exit port 303 until it is exposed to some form of optical radiation that breaks down or changes the physical properties of the material contained in the cap 304. This configuration is especially useful in configurations where the lubricant channel 301 is positioned adjacent to a lid 232 (FIGS. 2A and 6B) that is formed from a optically transparent material that is able to pass the desired wavelength of light that cause the cap 304 material to breakdown. In one embodiment, the cap is adapted to breakdown at an elevated temperature.

In one embodiment, a MEMS device element (not shown) is formed in or on one of the walls that enclose the processing region 234 so that a portion of the MEMS device element covers the exit port 303 of the lubricant channel 301. In this configuration the MEMS device element (not shown) can be externally actuated to cover or expose the exit port 303 so that the MEMS device element acts as a valve that can regulate the flow of lubricant material from the lubricant channel 301.

Lubricant Removal Steps

In one embodiment, it is desirable to connect a pump (not shown) up to the injection port 302 (FIG. 6B) so that it can be used to evacuate the processing region to remove one or more of the mobile lubricants and/or dilutant contained therein. In this case the pump may be used to evacuate the processing region to a sufficient pressure to cause the lubricant to vaporize and thus be swept from the device package. In another embodiment, it may be desirable to connect a gas source (not shown) to one injection port (e.g., item #301A in FIG. 7A) and then remove a cap (e.g., item #304 FIG. 7A) from another injection port (e.g., item #301B in FIG. 7A) so that gas delivered from the gas source can be used to sweep out any used or degraded lubricant material. In either case, these types of techniques can be used to remove old and/or degraded lubricant material so that new lubricant material can be added to the processing region, using the methods described above, to extend the life of the MEMS device.

While the foregoing is directed to embodiments of the present invention, other and further embodiments of the invention may be devised without departing from the basic scope thereof, and the scope thereof is determined by the claims that follow.

We claim:

1. A process for forming a plurality of sealed micromechanical device packages, each having a fluid channel, the process comprising:
   forming a lid having a first bonding surface;
   forming an interposer having a second bonding surface and a plurality of through holes formed therein, wherein an interior surface is formed in the interposer by each of the through holes;
   forming a plurality of micromechanical device assemblies on a surface of a substrate, wherein the micromechanical device assemblies each include a moveable component having a first contact surface that interacts with a second contact surface during device operation;
   bonding the first bonding surface to the second bonding surface using a first bonding process to form a lid assembly, wherein a plurality of recessed regions are formed between the interior surfaces of the interposer and a surface of the lid assembly;
   positioning and aligning the plurality of formed recessed regions relative to the plurality of micromechanical device assemblies formed on the substrate so that each of the micromechanical device assemblies can be placed within a recessed region;
   bonding the lid assembly to the substrate using a second bonding process to form a plurality of processing regions formed between the recessed regions and a surface of the substrate, wherein one or more of the micromechanical assemblies are positioned within the processing regions;
   forming a plurality of fluid channels in the interposer, lid, or substrate so that a portion of at least one fluid channel is in communication with each of the processing regions;
   dicing the substrate and the lid assembly to form a plurality of sealed micromechanical device packages, wherein each of the sealed micromechanical device packages comprise a portion of the substrate, a portion of the lid assembly and one or more of the micromechanical device assemblies positioned within the processing region, and wherein said at least one fluid channel formed in each of the sealed micromechanical device packages that is in communication with the processing region is not exposed to an exterior of said each of the sealed micromechanical device packages;
   removing material from a surface of at least one of the sealed micromechanical device packages to expose a portion of a fluid channel formed in the interposer, lid or substrate;
   disposing a lubricant in the fluid channel through the exposed portion of the fluid channel; and
   sealing the exposed portion of the fluid channel.

2. The process of claim 1, wherein the moveable component comprises a mirror.

3. The process of claim 1, further comprising forming one or more obstructions within each of the plurality of fluid channels, wherein the obstructions are adapted to act as a particle sieve.

4. The process of claim 1, further comprising forming two or more filters within the each of the plurality of fluid channels, wherein the filters each comprise one or more obstructions that are positioned within the fluid channel.

5. The process of claim 1, wherein the liquid lubricant is selected from a group consisting of perfluorinated polyethers, dichlordimethylsilane, octadecyltrichlorsilane, perfluoroctyltrichlorsilane, perfluorodecyl-trichlorosilane, and fluoroalkylsilane.

6. The process of claim 1, wherein each of the fluid channels that is formed in the interposer, lid, or substrate is configured to exert a capillary force on a lubricant that is to be disposed therein.

7. The process of claim 1, wherein each of the fluid channels that is formed in the interposer, lid, or substrate has a width that is between about 10 μm and about 800 μm and a depth that is between about 10 μm and about 200 μm.

8. The process of claim 1, wherein each of the fluid channels that is formed in the interposer, lid, or substrate has a volume that is between about 0.1 nl and about 1000 nl.

* * * * *